(12) United States Patent
Chae

(10) Patent No.: US 7,176,535 B2
(45) Date of Patent: Feb. 13, 2007

(54) THIN FILM TRANSISTOR ARRAY GATE ELECTRODE FOR LIQUID CRYSTAL DISPLAY DEVICE

(75) Inventor: Gee-Sung Chae, Incheon (KR)

(73) Assignee: LG. Philips LCD Co., Ltd., Seoul (KR)

( * ) Notice: Subject to any disclaimer, the term of this patent is extended or adjusted under 35 U.S.C. 154(b) by 206 days.

(21) Appl. No.: 10/843,453

(22) Filed: May 12, 2004

(65) Prior Publication Data

US 2004/0209407 A1  Oct. 21, 2004

Related U.S. Application Data

(62) Division of application No. 09/972,963, filed on Oct. 10, 2001, now Pat. No. 6,765,270.

(30) Foreign Application Priority Data

Oct. 10, 2000  (KR) .................. 10-2000-059429

(51) Int. Cl.
*H01L 29/76* (2006.01)

(52) U.S. Cl. .............. 257/390; 257/314; 257/327; 257/368; 257/401; 257/E51.005; 257/E29.151; 438/128; 438/129; 438/130; 438/275; 345/92

(58) Field of Classification Search .............. None
See application file for complete search history.

(56) References Cited

U.S. PATENT DOCUMENTS 5,946,551 A   8/1999  Dimitrakopoulos et al.

6,323,528 B1 * 11/2001 Yamazaki et al. .......... 257/411

FOREIGN PATENT DOCUMENTS

| JP | 55-099762 | 7/1980 |
|----|-----------|--------|
| JP | 62-154759 | 7/1987 |
| JP | 62154759 A * | 7/1987 |

* cited by examiner

*Primary Examiner*—Leonardo Andujar
*Assistant Examiner*—Scott R. Wilson
(74) *Attorney, Agent, or Firm*—Birch, Stewart, Kolasch & Birch, LLP

(57) ABSTRACT

The present invention discloses a TFT array substrate that is fabricated using a four-mask process and a method of manufacturing that TFT array substrate. The gate line and gate electrode of the array substrate is surrounded by the metallic oxide after finishing a first mask process using thermal treatment. As a result, the gate line and gate electrode are not eroded and damaged by the etchant and stripper during a fourth mask process. Further, buffering layer can optionally be formed between the substrate and the gate line and gate electrode. Thus, silicon ions and oxygen ions included in the substrate are not diffused into the gate line and electrode. Accordingly, the line defect such as a line open of the gate line and gate electrode is prevented, thereby preventing inferior goods while increasing the manufacturing yield.

14 Claims, 13 Drawing Sheets

Thermal treatment

Thermal treatment

THIN FILM TRANSISTOR ARRAY GATE ELECTRODE FOR LIQUID CRYSTAL DISPLAY DEVICE

RELATED APPLICATION

This application is a Rule 1.53(b) Divisional Application of application Ser. No. 09/972,963 filed Oct. 10, 2001 now U.S. Pat. No. 6,765,270, and also claims the benefit of Korean Patent Application No. 2000-59429, filed on Oct. 10, 2000, which is hereby incorporated by reference.

BACKGROUND OF THE INVENTION

1. Field of the Invention

The present invention relates to a liquid crystal display (LCD) device, and more particularly, to a thin film transistor (TFT) array substrate and a method of manufacturing the same.

2. Discussion of the Related Art

A liquid crystal display device uses the optical anisotropy and polarization properties of liquid crystal molecules to produce an image. Liquid crystal molecules have a definite orientational alignment as a result of their long, thin shapes. That orientational alignment can be controlled by an applied electric field. In other words, as an applied electric field changes, so does the alignment of the liquid crystal molecules. Due to the optical anisotropy, the refraction of incident light depends on the orientational alignment of the liquid crystal molecules. Thus, by properly controlling an applied electric field a desired light image can be produced.

A liquid crystal is classified into a positive liquid crystal and a negative liquid crystal, in view of an electrical property. The positive liquid crystal has a positive dielectric anisotropy such that long axes of liquid crystal molecules are aligned parallel with an electric field. Whereas, the negative liquid crystal has a negative dielectric anisotropy such that long axes of liquid crystal molecules are aligned perpendicular to an electric field.

While various types of liquid crystal display devices are known, active matrix LCDs having thin film transistors and pixel electrodes arranged in a matrix are probably the most common. This is because such active matrix LCDs can produce high quality images at reasonable cost.

FIG. 1 shows the configuration of a typical TFT-LCD device. The TFT-LCD device 11 includes upper and lower substrates 5 and 22 with an interposed liquid crystal 14. The upper and lower substrates 5 and 22 are called a color filter substrate and an array substrate, respectively.

In the upper substrate 5, on a surface opposing the lower substrate 22, black matrix 6 and color filter layer 7 that includes a plurality of red (R), green (G), and blue (B) color filters are formed in shape of an array matrix such that each color filter 7 is surrounded by the black matrix 6. Further on the upper substrate 5, a common electrode 18 is formed and covers the color filter layer 7 and the black matrix 6.

In the lower substrate 22, on a surface opposing the upper substrate 5, thin film transistors (TFTs) "T", as switching devices, are formed in the shape of an array matrix corresponding to the color filter layer 7, and a plurality of crossing gate and data lines 13 and 15 are positioned such that each TFT "T" is located near each crossover point of the gate and data lines 13 and 15. Further in the lower substrate 22, a plurality of pixel electrodes 17 are formed on an area defined by the gate and data lines 13 and 15. The area there defined is called a pixel region "P". The pixel electrode 17 is usually formed from a transparent conductive material having good transmissivity, for example, indium-tin-oxide (ITO) or indium-zinc-oxide (IZO).

The pixel and common electrodes 17 and 18 generate electric fields that control the light passing through the liquid crystal cells. By controlling the electric fields desired characters or images are displayed.

To complete the array substrate described above, a depositing technique, a photolithography technique, and an etching technique are repeated several times. Namely, a typical TFT array substrate manufacturing process requires repeated steps of depositing and patterning various layers. The patterning steps involve photolithography masks. Each photolithography step is facilitated using one mask, and the number of masks used in the fabrication process is a critical factor in determining the number of patterning steps. Thus, the production cost depends heavily on the number of masks used in the manufacturing process. Moreover, the margin of error caused by a plurality of manufacturing processes depends heavily on the number of masks, and thus, the ratio of inferior goods is also lowered if the number of the mask is lowered.

Accordingly, the TFT array substrate, nowadays, tends to be fabricated using four mask processes instead of five mask processes. However, when using the four mask processes, a plurality of layers that are stacked upon each other are simultaneously etched. Also, the etching ratios of the different layers should be adjusted during the etching process. As a result, some portions of the lines, such as the gate and data lines, become exposed and some portions of the electrodes, such as the source, drain and gate electrodes, are also exposed. Above all, since the gate line and the gate electrode are usually formed of a low-resistance material when fabricating the TFT array substrate using the four mask processes, the exposed low-resistance material is gradually eroded by the etchant during the manufacturing processes.

Now, referring to the attached drawings, the erosion of the gate line and gate electrode will be explained in detail hereinafter.

FIG. 2 is a schematic partial plan view showing pixels of the TFT array substrate that is fabricated using four mask processes. As shown, the TFT array substrate includes a gate line 13 formed on a transparent substrate, a data line 15 perpendicularly crossing the gate line 13, a TFT "T" formed at regions near the crossover point of the gate and data lines 13 and 15, and a pixel electrode 17 connected to the TFT. A pixel region where the pixel electrode 17 is positioned is defined by the gate and data electrodes 13 and 15.

Still referring to FIG. 2, the TFT "T" is comprised of a gate electrode 31, a source electrode 33 and a drain electrode 35. The gate electrode 31 is extended from the gate line 13 and the source electrode 33 is extended from the data line 13. Further, the drain electrode 35 is spaced apart from the source electrode 33 and a channel region "CH" is formed between the source and drain electrodes 33 and 35. The gate electrode 31 and gate line 13 are formed using a first mask. The data line 15 and source and drain electrodes 33 and 35 are formed using a second mask. Also, the pixel electrode 17 is formed using a fourth mask. In the case of forming the TFT array substrate using the four mask processes, an active layer 37 is not formed independently using another patterning process. Namely, the active layer 37 is simultaneously formed when a protection layer 41 is patterned using a third mask, and thus, the active layer are located along and under the data line 15, source electrode 33 and drain electrode 35.

However, during the third mask process that patterns the protection layer 41, portions "B" and "C" of the gate electrode 31 are exposed. Thereafter, these exposed portions "B" and "C" of the gate electrode 31 are eroded by the stripper that removes the photo resist and by the etchant that removes a metallic layer during the fourth mask process.

For further explanation, a manufacturing process of the TFT array substrate is explained referring to FIG. 3A to 3D.

FIGS. 3A to 3D are plan views and FIGS. 4–11 are corresponding cross-sectional views that relate to lines III—III and IV—IV of related art FIG. 2, and illustrate a process for manufacturing a related art TFT array substrate for use in the liquid crystal display device.

FIGS. 3A, 4 and 5 show a first mask process. As shown, a first metal layer, for example copper (Cu), is deposited on a substrate 22, and then patterned so as to form the gate line 13 and gate electrode 31 using a first mask. After that, a gate insulation layer 32, an amorphous silicon layer 34, an impurity-included amorphous silicon layer 36, and a second metal layer 38 are deposited in series on a surface of the substrate 22 having the gate line 13 and gate electrode 31.

FIGS. 3B, 6 and 7 show a second mask process. As shown, the second metal layer 38 of FIGS. 4 and 5 is patterned so as to form the data line 15, the source electrode 33 and the drain electrode 35. Again, the data line 15 is perpendicular to the gate line 13 and the source electrode 33 is extended from the data line 15 over the pixel region "P" of FIG. 2. Also, the drain electrode 35 formed in the pixel region is spaced apart from the source electrode 33.

Next, the impurity-included amorphous silicon layer 36 of FIGS. 4 and 5 is patterned using the patterned second metal layer as masks. Thus, an ohmic contact layer 39 is formed under the patterned second metal layer such as the data line 15 and the source and drain electrodes 33 and 35. Moreover, a portion of the amorphous silicon layer 34 between the source and drain electrodes 33 and 35 is exposed so as to form the channel region "CH".

FIGS. 3C, 8 and 9 show a third mask process. The protection layer 41 is deposited on the amorphous silicon layer 34 of FIGS. 6 and 7 and on the patterned second metal layer. After that, a drain contact hole 43 is formed by patterning the protection layer 41. At this time, the protection layer 41 is mostly removed except portions that protect the data line 15, channel region "CH" and source and drain electrodes 33 and 35. Also, the amorphous silicon layer 34 of FIGS. 6 and 7 and the gate insulation layer 32 are simultaneously removed except the portions under the channel region "CH" and under the patterned second metal layer (i.e., the data line 15 and the source and drain electrodes 33 and 35). Thus, under the patterned protection layer 41, the active layer 37 is formed. Further, in this structure of the TFT, since this active layer 37 does not cover the whole gate electrode 31 in order to form the channel region "CH", the protection layer 41 and the active layer 37 exist between the source electrode 33 and the drain electrode 35.

As a result, since the channel region "CH" is formed between the source and drain electrodes 33 and 35, the portions "B" and "C" of the gate electrode 31 are exposed after performing this third mask process. Moreover, the gate line 13 is also exposed.

FIGS. 3D, 10 and 11 show a fourth mask process. A transparent conductive material, such as indium-tin-oxide (ITO) or indium-zinc-oxide (IZO), is deposited on the surfaces of the above-mentioned intermediates. Thereafter, the transparent conductive material is patterned to form the pixel electrode 17 that is electrically connected with the drain electrode 35 through the drain contact hole 43.

As described above, after performing the third mask process, the exposed gate electrode portions "B" and "C" and the gate line 13 are eroded and damaged during the fourth mask process. Namely, when forming the pixel electrode 17, the exposed gate line 13 and gate electrode portions "B" and "C" are eroded and damaged by the etchant that etches the transparent conductive material. Subsequently, when removing the photo resist that is formed for the pixel electrode 17, the exposed gate line 13 and gate electrode portions "B" and "C" are secondly eroded and damaged by the stripper.

Further, if the gate line and the gate electrode are made of copper (Cu), the copper ions are diffused into the liquid crystal layer after the liquid crystal panel is complete. Thus, the liquid crystal display device malfunctions due to the diffused copper ions.

SUMMARY OF THE INVENTION

Accordingly, the present invention is directed to a method of manufacturing a thin film transistor that substantially obviates one or more of the problems due to limitations and disadvantages of the related art.

An object of the present invention is to provide a method of manufacturing a TFT array substrate (as well as a TFT array substrate itself) that prevents the erosion and damage of the gate electrode and gate line.

Another object of the present invention is to provide a method of manufacturing a TFT array substrate (as well as a TFT array substrate itself) that prevents the diffusion of the copper ions from the gate line and gate electrode.

Another object of the present invention is to provide a method of manufacturing a TFT array substrate (as well as a TFT array substrate itself) that prevents the gate line and gate electrode from diffusion of silicon ions and oxygen ions.

In order to achieve the above object, the preferred embodiment of the present invention provides a TFT array substrate for use in a liquid crystal display device, including: a gate line arranged in a transverse direction over a substrate; a metallic oxide layer surrounding the gate line; a data line arranged in a longitudinal direction perpendicular to the gate line over the substrate; a thin film transistor formed near the crossing of the gate and data lines, the thin film transistor comprising: a gate electrode over the substrate, the gate electrode being extended from the gate line and surrounded by the metallic oxide; a gate insulation layer on the metallic oxide surrounding the gate electrode; an active layer and an ohmic contact layer formed on the gate insulation layer; a source electrode formed on the ohmic contact layer over the gate electrode and extended from the data line; and a drain electrode formed on the ohmic contact layer over the gate electrode and spaced apart from the source electrode; a protection layer formed over the thin film transistor, the protection layer having a drain contact hole that exposes a portion of the drain electrode; and a pixel electrode formed in a pixel region that is defined by the gate and data lines, the pixel electrode contacting the drain electrode through the drain contact hole.

The metallic oxide is one of tantalum oxide ($TaO_x$), chrome oxide ($CrO_x$), titanium oxide ($TiO_x$) and tungsten oxide ($WO_x$).

A TFT array substrate for use in a liquid crystal display device further includes a buffering layer between the substrate and the gate line and gate electrode. The metallic oxide is made of one of tantalum oxide (TaOX) and titanium oxide (TiOX) that are respectively made from tantalum (Ta) and titanium (Ti) preferably using an oxidation reaction at a temperature of greater than 400° C. The buffering layer is one of tantalum nitride (TaN) and titanium nitride (TiN). Moreover, the buffering layer alternatively can be one of silicon nitride ($SiN_x$) and silicon oxide ($SiO_2$).

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a method of manufacturing a TFT arrays substrate for use in a liquid crystal display device, comprising: forming a first metal layer over a substrate; forming a second metal layer on the first metal layer; patterning the first and second metal layers so as to form a gate line and a gate electrode; thermally-treating the substrate having the patterned first and second metal layers so as to diffuse material from the patterned first metal layer over the patterned first metal layer and then to form a metallic oxide layer surrounding the second metal layer by oxidizing the diffused material of the first metal layer; forming a gate insulation layer on the substrate, the gate line and the metallic oxide layer; forming an amorphous silicon layer on the gate insulation layer; forming an impurity-doped amorphous silicon layer on the amorphous silicon layer; forming a third metal layer on the impurity-included amorphous silicon layer; patterning the third metal layer so as to form a data line, a source electrode and a drain electrode; patterning the impurity-doped amorphous silicon layer using the patterned third metal layer as masks so as to form an ohmic contact layer and a channel region in the amorphous silicon layer between the source and drain electrodes; forming a protection layer on the amorphous silicon layer and on the patterned third metal layer; patterning the protection layer, the amorphous silicon layer and the gate insulation layer except portions that correspond to the patterned third metal layer and channel region; depositing a transparent conductive material in a pixel region that is defined by the gate and data lines; and patterning the transparent conductive material so as to form a pixel electrode that contacts the drain electrode.

The first metal layer is one of tantalum (Ta), chrome (Cr), titanium (Ti) and tungsten (W). These materials become the metallic oxide layer, i.e., the metallic oxide is one of tantalum oxide (TaOX), chrome oxide (CrOX), titanium oxide (TiOX) and tungsten oxide (WOX) after finishing the thermal treatment. The second metal layer is copper (Cu). The third metal layer is one of chrome (Cr), tantalum (Ta), titanium (Ti), tungsten (W) and molybdenum (Mo).

A method of manufacturing a TFT arrays substrate for use in a liquid crystal display device further includes forming a buffering layer on the substrate before forming the first metal layer. The thermal treatment is preferably performed at a temperature of greater than 400° C. The buffering layer can be one of tantalum nitride (TaN), titanium nitride (TiN) silicon nitride ($SiN_x$) and silicon oxide ($SiO_2$).

It is to be understood that both the foregoing general description and the following detailed description are exemplary and explanatory and are intended to provide further explanation of the invention as claimed.

BRIEF DESCRIPTION OF THE DRAWING

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENTS

Reference will now be made in detail to the preferred embodiments of the present invention, example of which is illustrated in the accompanying drawings.

Figure 1:
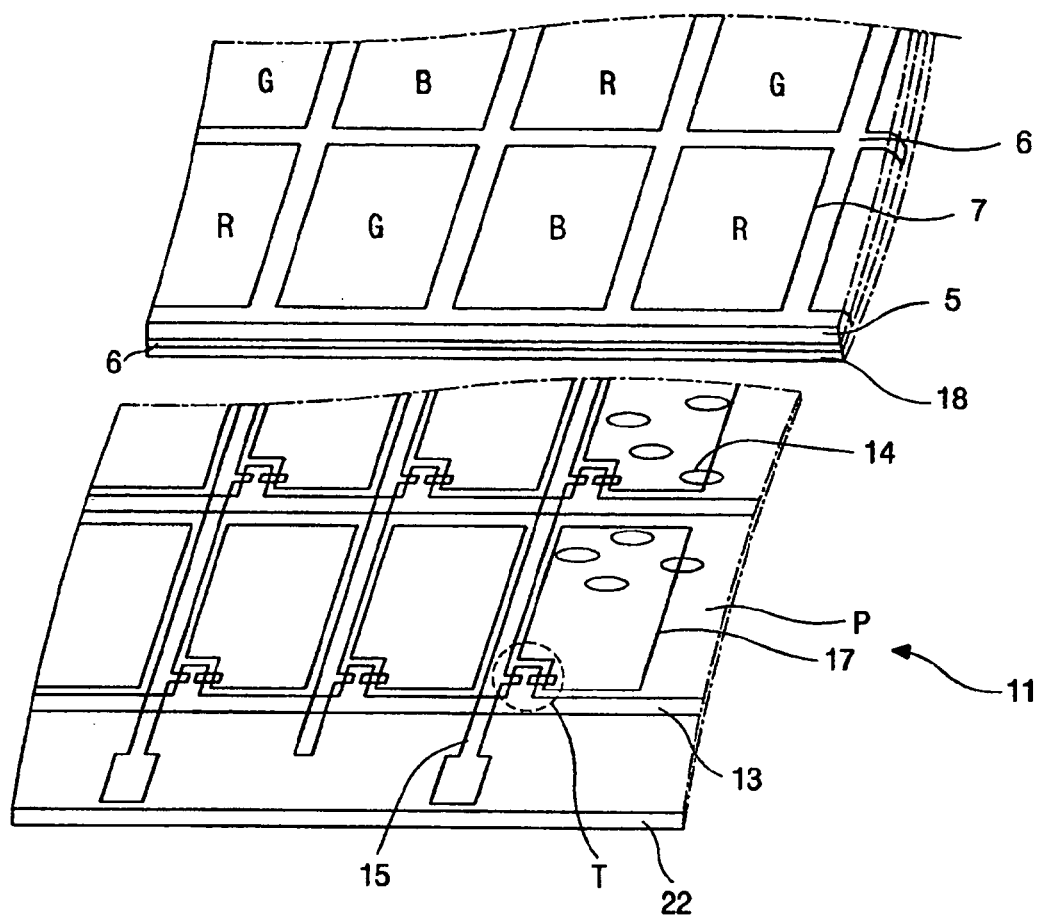
FIG. 1 shows the configuration of a typical related art TFT-LCD device.
Figure 2:
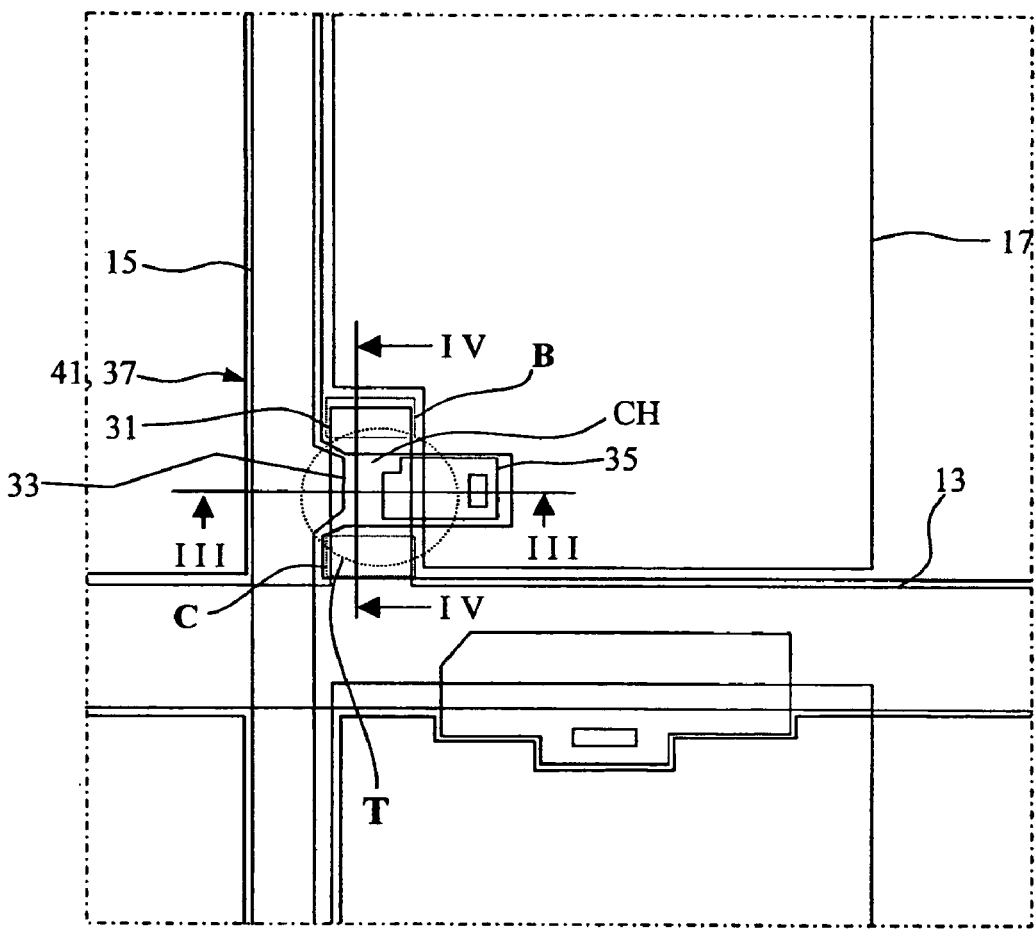
FIG. 2 is a schematic partial plan view showing pixels of the TFT array substrate that is fabricated using four mask processes according to the related art.
Figure 3A:
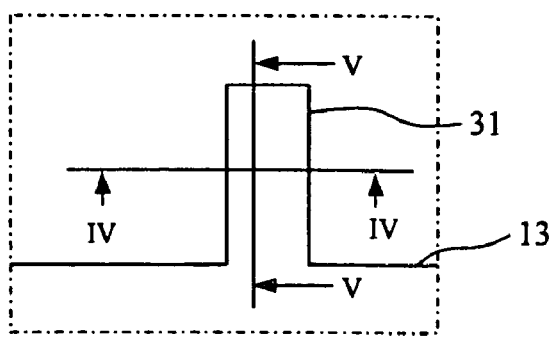
FIGS. 3A to 3D are plan views and FIGS. 4–11 are corresponding cross-sectional views that illustrate a process for manufacturing a TFT array substrate for use in the liquid crystal display device according to the related art.
Figure 3B:
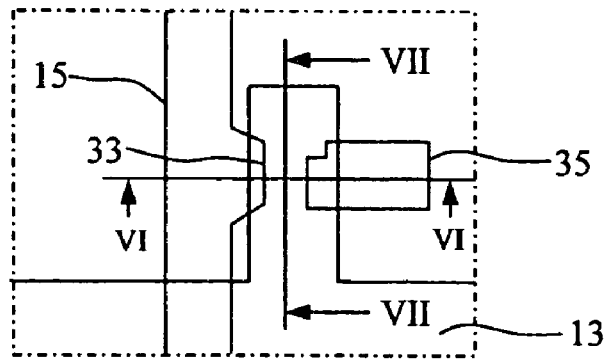
Figure 3C:
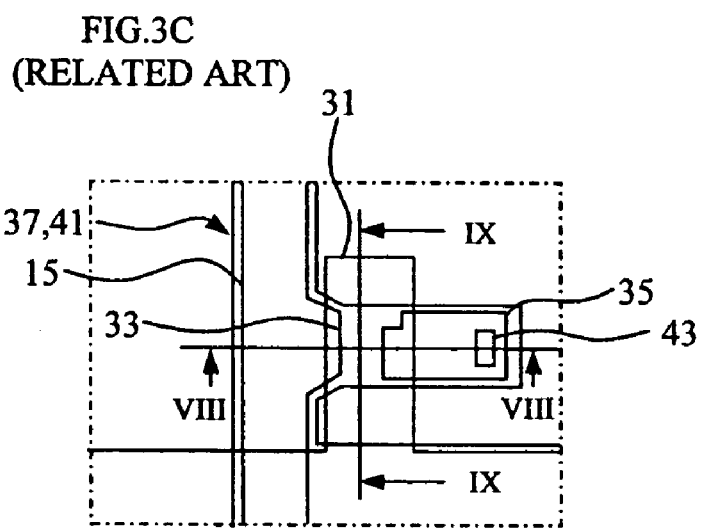
Figure 3D:
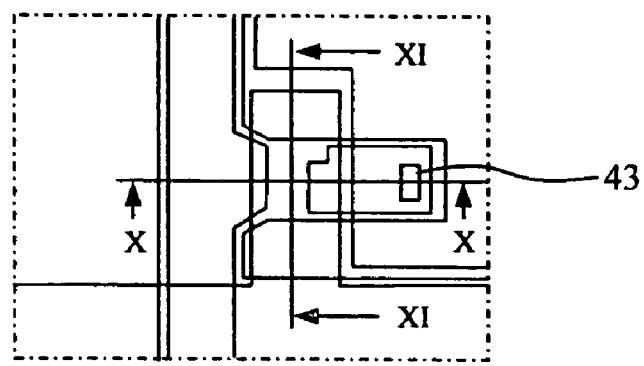
Figure 4:
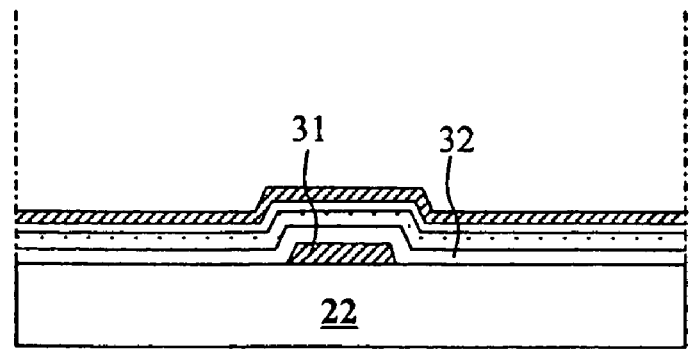
Figure 5:
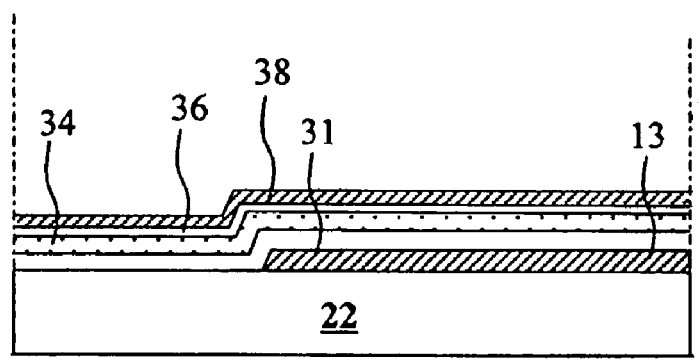
Figure 6:
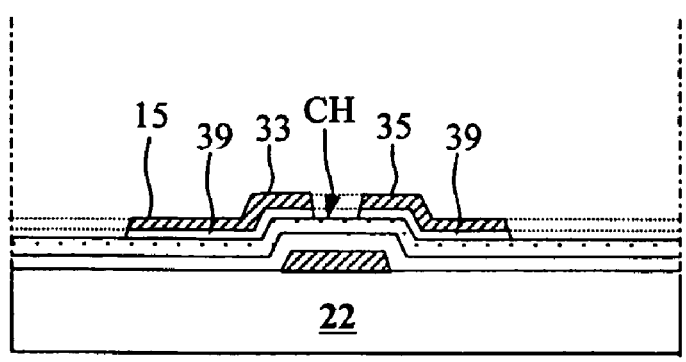
Figure 7:
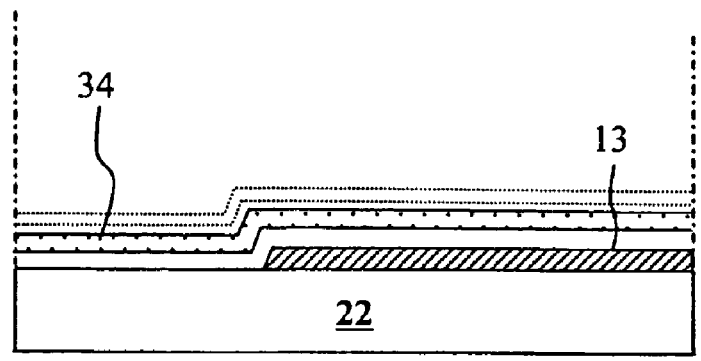
Figure 8:
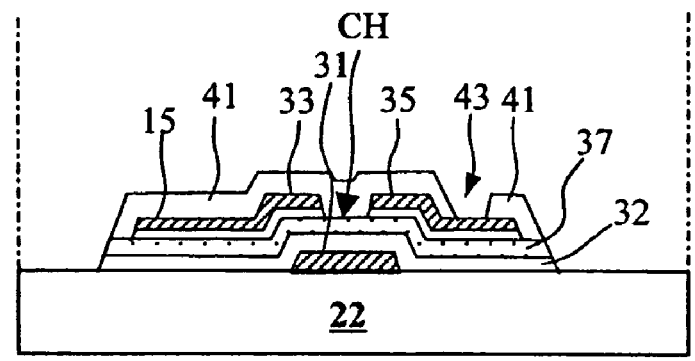
Figure 9:
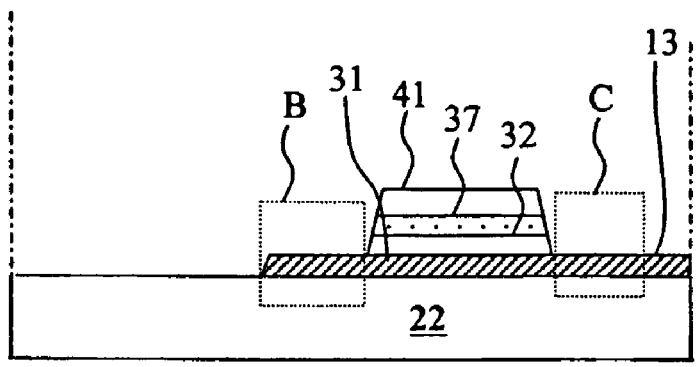
Figure 10:
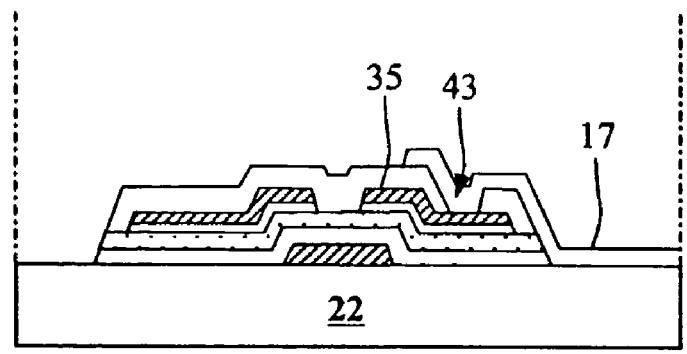
Figure 11:
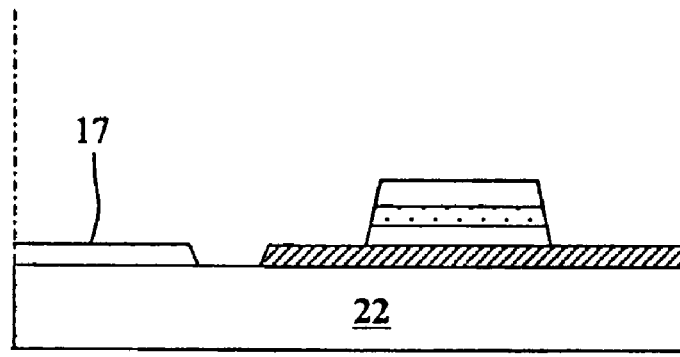

FIGS. 12A to 12D are plan views and FIGS. 13S–20 are cross-sectional views that relate to lines III—III and IV—IV of related art FIG. 2, and illustrate a process according to a first embodiment of the invention for manufacturing a TFT array substrate similar to related art FIG. 2 for use in the liquid crystal display device. In this description, the plan views of the preferred embodiment are similar to the conventional art described in FIGS. 2–3D.

FIGS. 12A, 13A–13C and 14A–14C show a first mask process, wherein a first metal layer 111 is formed at first on a substrate 100 by depositing a metallic material such as of tantalum (Ta), chrome (Cr), titanium (Ti), tungsten (W) and the like. These metallic materials can easily diffuse at a temperature on and along the surface of a second metal layer that is formed in a later step. After that, the second metal layer 130, such as copper (Cu), is deposited on the first metal layer 111. And then, the second metal layer 130 is patterned so as to form the gate line 113 and gate electrode 131 using a first mask. At this time, the portions of the first metal layer 111 corresponding to the gate line 113 and gate electrode 131 are simultaneously patterned (see FIGS. 13B and 14B).

Figure 13A:
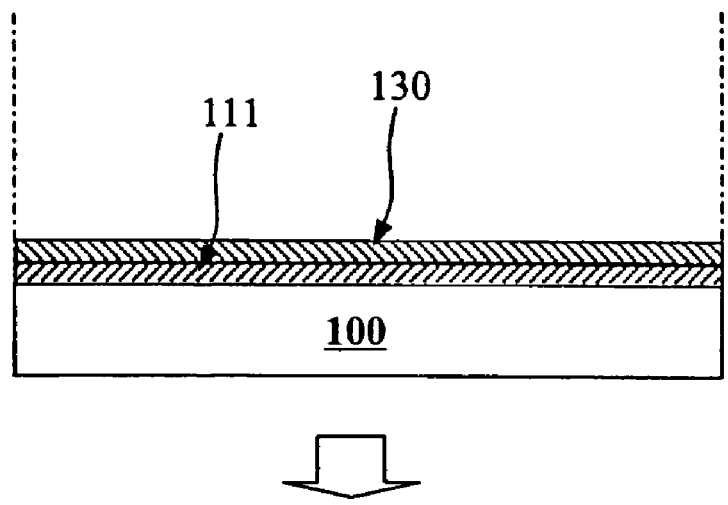
FIGS. 13A to 13C and 14A to 14C are cross-sectional views cut along lines XIII—XIII and XIV—XIV of FIG. 12A, respectively.
Figure 13B:
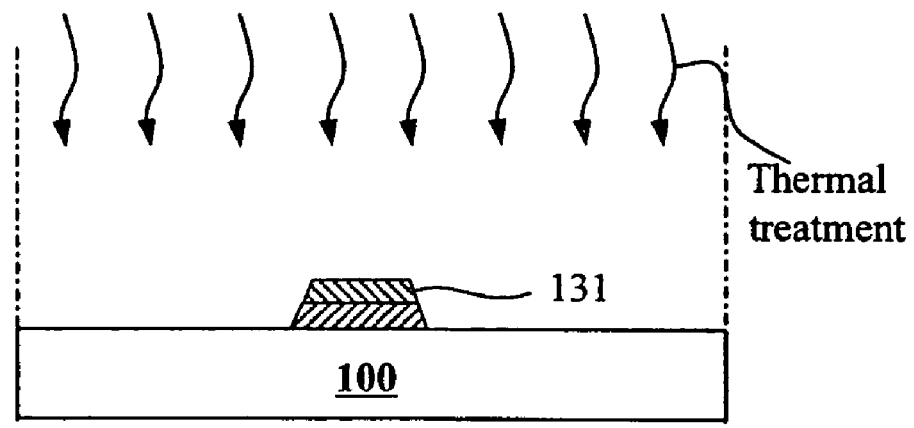
Figure 13C:
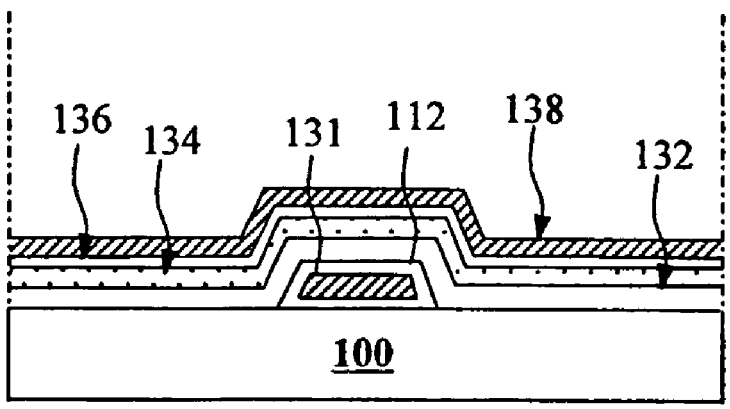
Figure 14A:
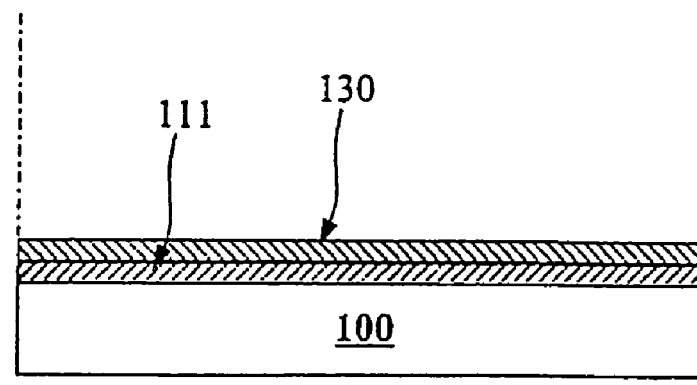
Figure 14B:
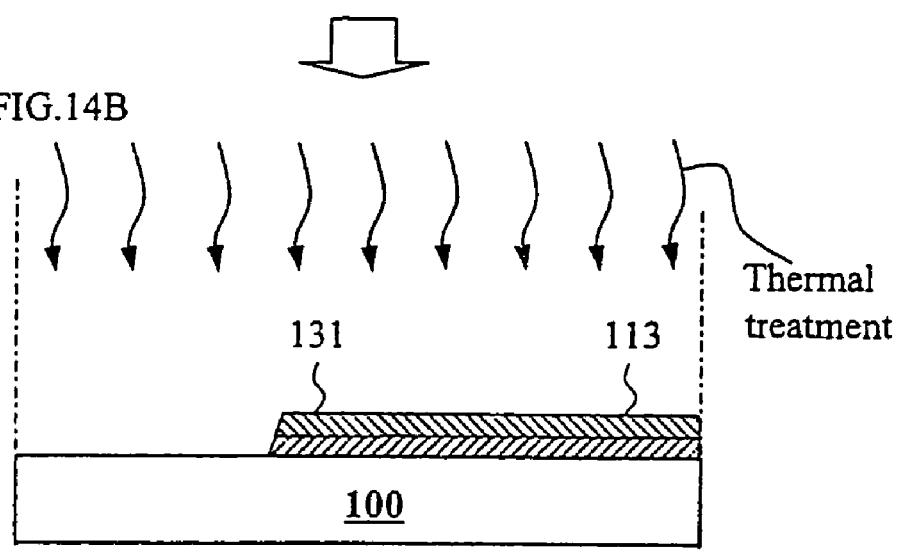

Next, the substrate 100 having the gate line 113 and the gate electrode 131 is thermally-treated at a designated temperature (again, see FIGS. 13B and 14B). This thermal treatment diffuses the material of the patterned first metal layer along the surface of the patterned second metal layer (for example, copper (Cu)) so that material of the first metal layer exists on the surface of the patterned second metal layer. At this time, the patterned first metal layer reacts with oxygen (O) and becomes a metallic oxide 112 such as tantalum oxide (TaO$_X$), chrome oxide (CrO$_X$), titanium oxide (TiO$_X$), tungsten oxide (WO$_X$) or the like. In other words, the metallic oxide layer 112 caused by the oxidation reaction is formed around the gate line 113 and gate electrode 131 during the thermal treatment process (see the result in FIGS. 13C and 14C).

Figure 14C:
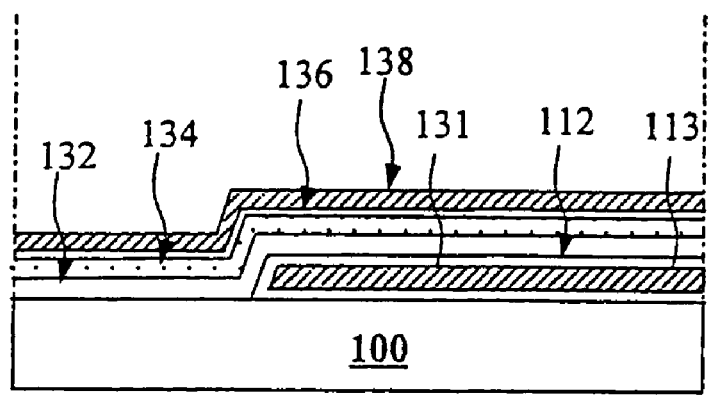

After that, a gate insulation layer 132 is formed on the substrate 100 and on the metallic oxide layer 112 that surrounds the gate line 113 and gate electrode 131 (see FIGS. 13C and 14C). The gate insulation layer 132 is an insulation material, e.g., an organic material, such as benzocyclobutene (BCB) or a material related to or containing acryl-based resin, or an inorganic material, such as silicon oxide (SiO$_X$) or silicon nitride (SiN$_X$). Further, an amorphous silicon layer 134, an impurity-included amorphous silicon layer 136, and a third metal layer 138 are deposited in series over the gate insulation layer 132. The third metal layer 138 is a metallic material such as chromium (Cr), tantalum (Ta), titanium (Ti), tungsten (W), molybdenum (Mo) and the like.

Figure 12A:
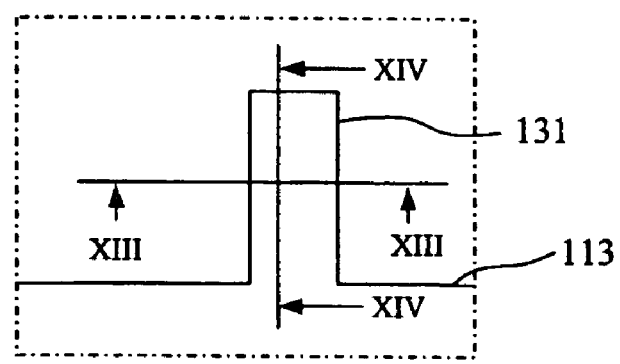
FIGS. 12A to 12D are plan views that illustrate a process according to a first embodiment of the invention for manufacturing a TFT array substrate for use in the liquid crystal display device.
Figure 12B:
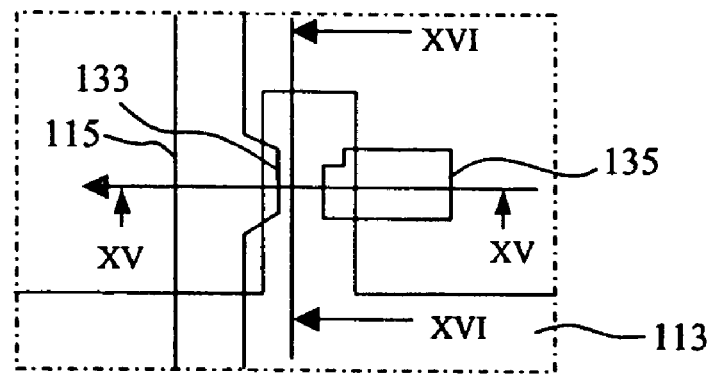
Figure 15:
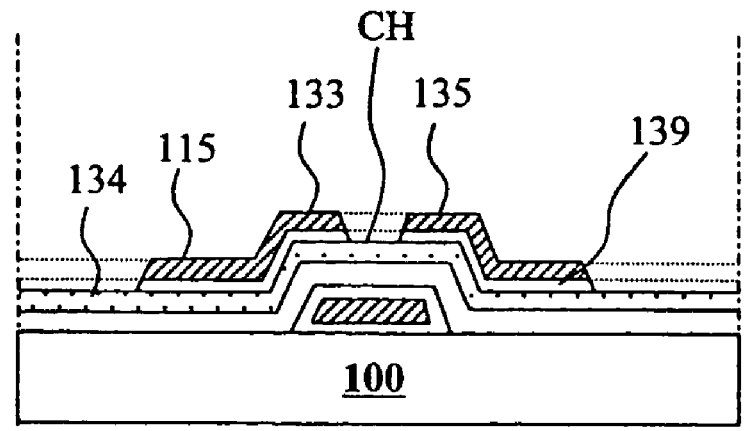
FIGS. 15 and 16 are cross-sectional views cut along lines XV—XV and XVI—XVI of FIG. 12B, respectively.
Figure 16:
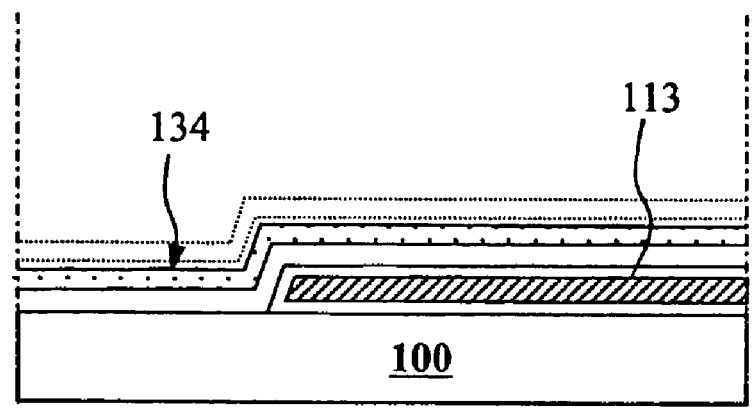

FIGS. 12B, 15 and 16 show a second mask process. As shown, the third metal layer 138 of FIGS. 13C and 14C is patterned so as to form the data line 115, the source electrode 133 and the drain electrode 135. The data line 115 is perpendicular to the gate line 113 and the source electrode 133 is extended from the data line 115 over the pixel region "P" of FIG. 2. Also, the drain electrode 135 formed in the pixel region is spaced apart from the source electrode 133.

Figure 12C:
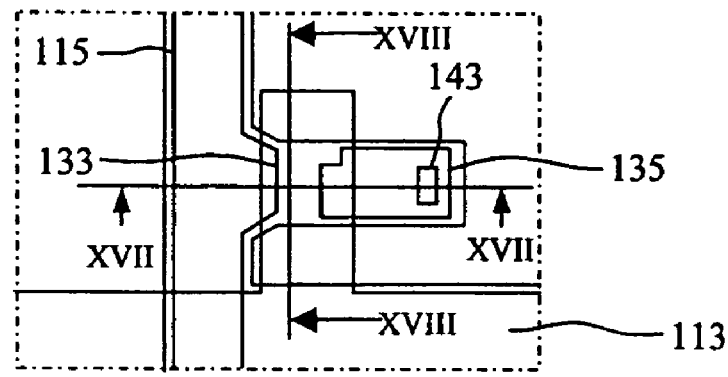
Figure 17:
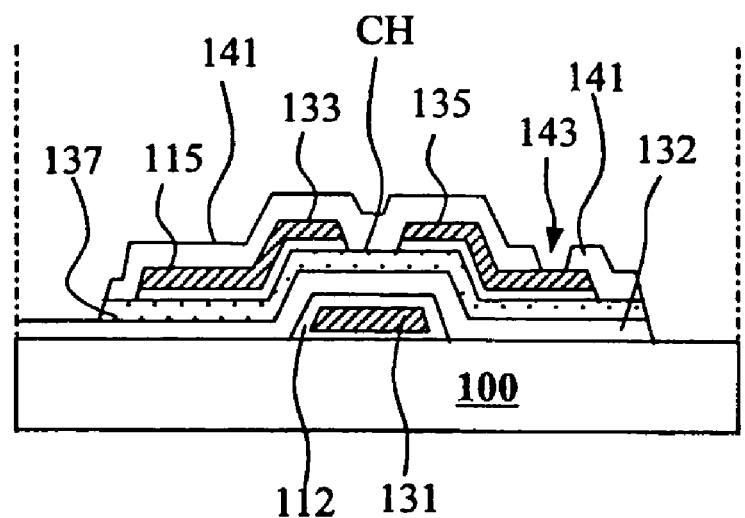
FIGS. 17 and 18 are cross-sectional views cut along lines XVII—XVII and XVIII—XVIII of FIG. 12C, respectively.
Figure 18:
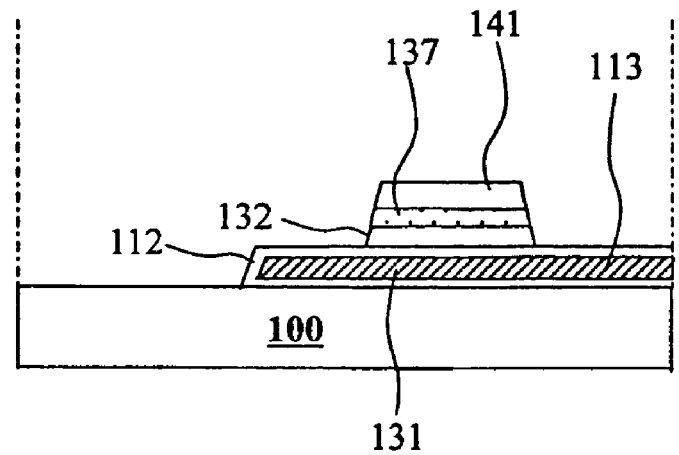

Next, the impurity-included amorphous silicon layer 136 of FIGS. 13C and 14C is patterned using the patterned third metal layer portions 115, 133 and 135 as masks. Thus, an ohmic contact layer 139 is formed under the patterned third metal layer (i.e., the data line 115 and the source and drain electrodes 133 and 135). Moreover, a portion of the amorphous silicon layer 134 between the source and drain electrodes 133 and 135 is also exposed so as to form the channel region FIGS. 12C, 17 and 18 show a third mask process. The protection layer 141 is deposited on the amorphous silicon layer 134 of FIGS. 15 and 16 and on the patterned portions 115, 133 and 135 of the third metal layer. The passivation layer 141 is an insulation material, e.g., an organic material, such as benzocyclobutene (BCB) or a material relating to or containing acryl-based resin, or an inorganic material, such as silicon oxide (SiO$_X$) or silicon nitride (SiN$_X$). After that, a drain contact hole 143 is formed by patterning the protection layer 141. At this time, the protection layer 141 is mostly removed except portions that protect the data line 115, channel region "CH" and source and drain electrodes 133 and 135. Also, the amorphous silicon layer 134 of FIGS. 15 and 16 and the gate insulation layer 132 are simultaneously removed except the portions corresponding to the channel region "CH" and the portions under the patterned third metal layer (i.e., the data line 115 and the source and drain electrodes 133 and 135). Thus, under the patterned protection layer 141, the active layer 137 is formed.

Figure 12D:
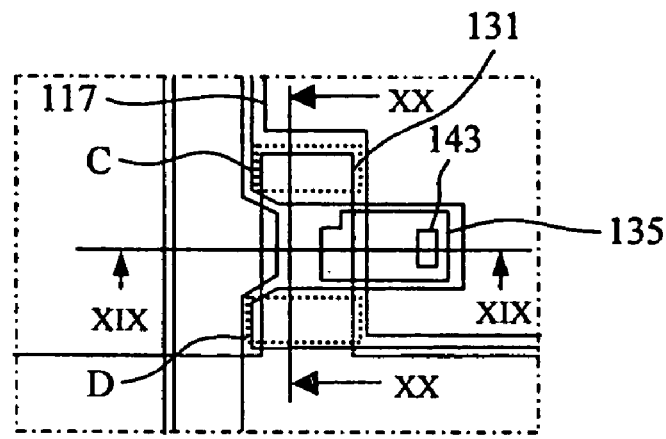
Figure 19:
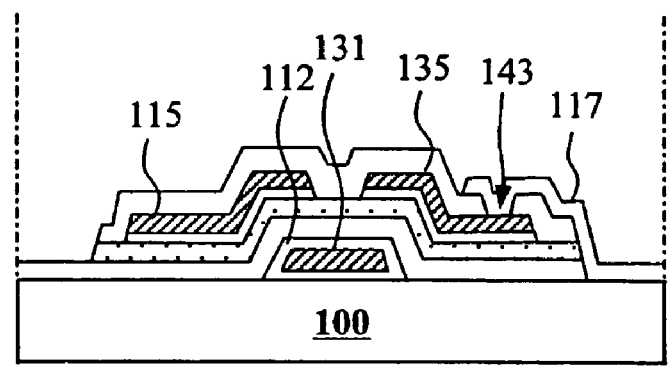
FIGS. 19 and 20 are cross-sectional views cut along lines XIX—XIX and XX—XX of FIG. 12D, respectively.
Figure 20:
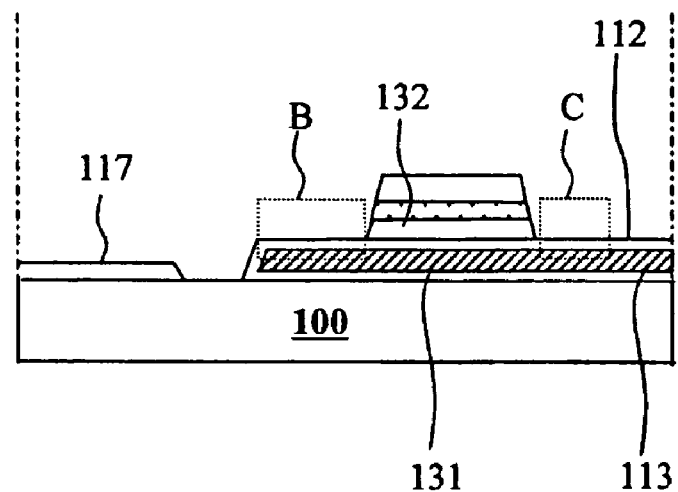

FIGS. 12D, 19 and 20 show a fourth mask process. A transparent conductive material, such as indium-tin-oxide (ITO) or indium-zinc-oxide (IZO), is deposited on the surfaces of the above-mentioned intermediates. Thereafter, the transparent conductive material is patterned to form the pixel electrode 117 that is electrically connected with the drain electrode 135 through the drain contact hole 143. The pixel electrode 117 is located in the pixel region "P" of FIG. 2.

According to a principle of the present invention, although the portions "B" and "C" of the gate electrode 131 and the gate line 113 are exposed during the fourth mask process, they are not eroded and damaged by the etchant and stripper. That is because the gate line 113 and the gate electrode 131 are protected by the metallic oxide layer 112 that surrounds the patterned second metal layer. Further, although the gate line 113 and the gate electrode 131 are made of copper (Cu), the copper ions are not diffused into the liquid crystal layer after the liquid crystal panel is complete due to the metallic oxide layer 112. Thus, the malfunction caused by the diffused copper ions into the liquid crystal layer does not occur any more in the liquid crystal display device.

Now, reference will be made in detail to a second preferred embodiment of the present invention, example of which is illustrated in the accompanying drawings.

In the first embodiment described above, if the first metal layer is tantalum (Ta) or titanium (Ti), some problems occur in the thermal treatment process. The thermal-treating temperature is made greater than 400° C. in order to diffuse tantalum (Ta) or titanium (Ti) on the surface of the second metal layer (for example, copper (Cu)). But silicon ions and oxygen ions included in the substrate also get diffused into the patterned second metal layer. As a result, carrier mobility of the gate line and gate electrode is lowered. According to the principle of the second embodiment, a simple structure is adopted in order to prevent the decrease of the carrier mobility.

FIGS. 21A–21C and 22A–22C are cross-sectional views that relate to lines III—III and IV—IV of FIG. 2, respectively, and illustrate a process according to the second embodiment of the invention for manufacturing a TFT array substrate similar to related art FIG. 2 for use in the liquid crystal display device.

Figure 21A:
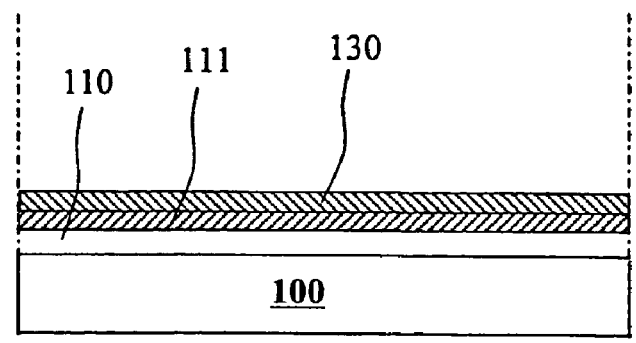
FIGS. 21A to 21C and 22A–22C are cross-sectional views that illustrate a process according to a second embodiment of the invention for manufacturing a TFT array substrate for use in the liquid crystal display device.
Figure 22A:
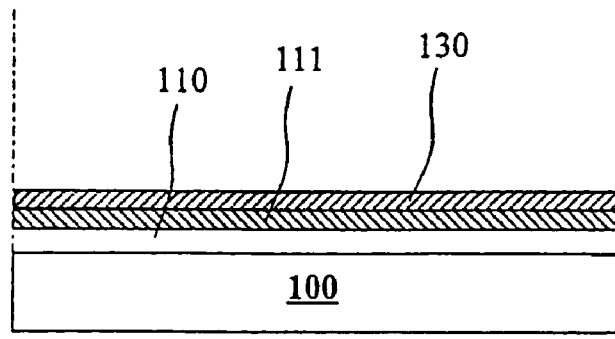

Referring to FIG. 21A and 22A, a buffering layer 110 is formed on the substrate 100 by depositing, e.g., tantalum nitride (TaN) or titanium nitride (TiN). Alternatively, the buffering layer 110 can be made, e.g., of silicon oxide (SiO$_2$) or silicon nitride (SiN$_X$). After that, a first metal layer 111 and a second metal layer 130 are deposited in series over the buffering layer 110 just as described in FIGS. 12A, 13A–13C and 14A–14C.

Figure 21B:
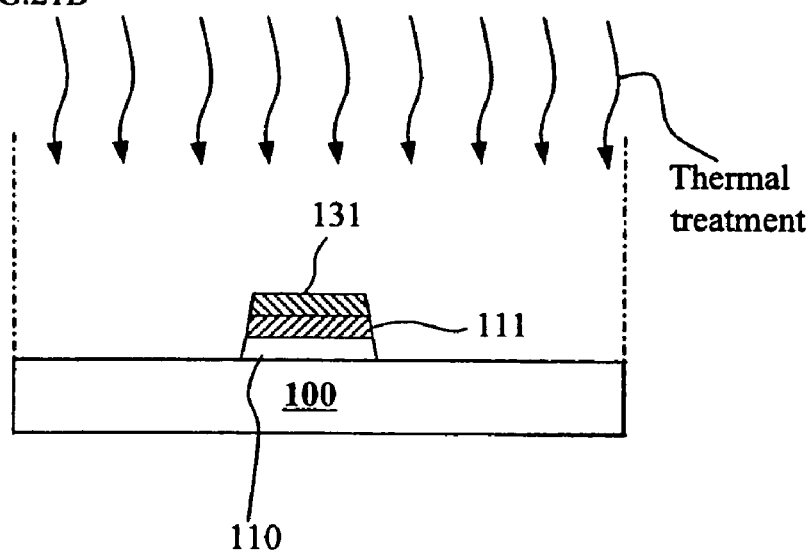
Figure 22B:
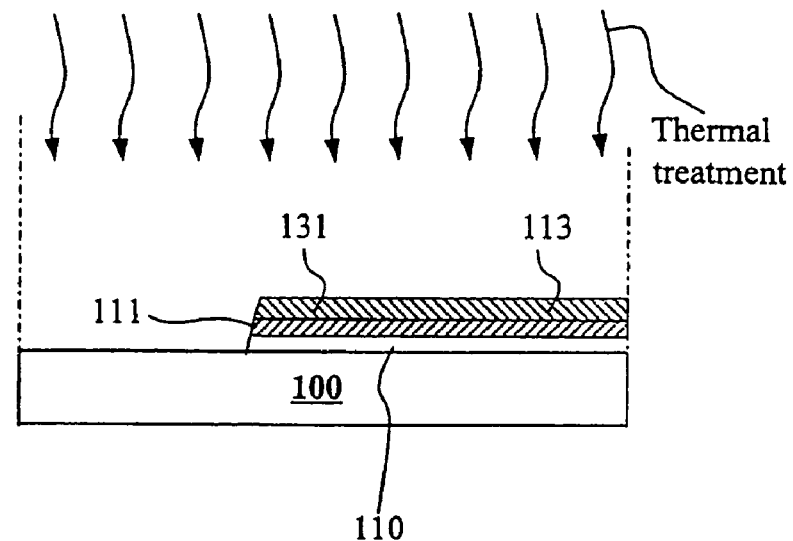

Next, referring to FIGS. 21B and 22B, the buffering layer 110, the first metal layer 111 and the second metal layer 130 are patterned so as to form the gate line 113 and gate electrode 131. After that, the substrate 100 having the gate line 113 and the gate electrode 131 is thermally-treated at a temperature of greater than 400° C.

Figure 21C:
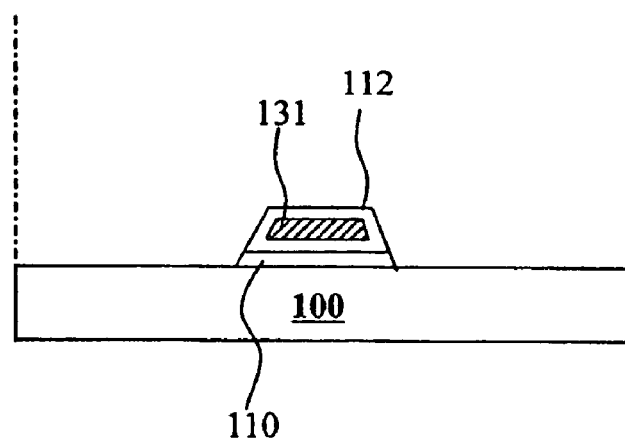
Figure 22C:
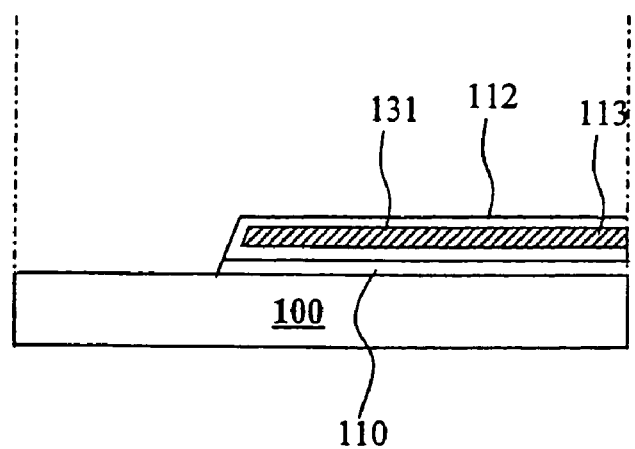

Now, referring to FIGS. 21C and 22C, the above-mentioned thermal treatment diffuses the first metal layer 111 of FIGS. 21B and 22B along the surface of the patterned second metal layer (i.e., the gate line 113 and the gate electrode 131) so that material of the first metal layer exists on the surface of the patterned second metal layer. At this time, the first metal layer reacts with oxygen (O) and becomes a metallic oxide layer 112 such as tantalum oxide (TaO$_X$) or titanium oxide (TiO$_X$). In other words, the metallic oxide layer 112 caused by the oxidation reaction is formed around the gate line 113 and gate electrode 131 after thermal treatment.

Here, the next processes of the second embodiment are omitted because they are the same as the processes depicted in FIGS. 12B–12D and 15–20. According to the second embodiment, the silicon ions and the oxygen ions are prevented from being diffused from the substrate into the gate line and into the gate electrode due to the buffering layer. In other words, the buffering layer protects the gate line and gate electrode against diffusion of the silicon ions and oxygen ions. Thus, the gate line and gate electrode are not deteriorated by these ions, and the carrier mobility is not reduced.

Further, the principles of the present invention can be used in the in-plane switching mode liquid crystal display (IPS-LCD) device.

Accordingly, as described above, since the TFT array substrate for use in the liquid crystal display device is fabricated using the four-mask process without any erosion and damage in the gate line and gate electrode, the line defect such as a line open or break of the gate line and gate electrode is prevented. And, copper ions do not diffuse into the liquid crystal layer after the liquid crystal display is complete. Thus, malfunction does not occur in the liquid crystal display device, thereby preventing inferior goods while increasing the manufacturing yield.

It will be apparent to those skilled in the art that various modifications and variation can be made in the method of manufacturing a thin film transistor of the present invention without departing from the spirit or scope of the invention. Thus, it is intended that the present invention cover the modifications and variations of this invention provided they come within the scope of the appended claims and their equivalents.

What is claimed is:

1. A method of forming a TFT array substrate for use in a liquid crystal display device, comprising:
    forming a first metal layer over a substrate;
    forming a second metal layer on the first metal layer;
    patterning the first and second metal layers so as to form a gate line and a gate electrode;
    thermally-treating the substrate having the patterned first and second metal layers so as to diffuse material from the patterned first metal layer over the patterned second metal layer and then to form a metallic oxide layer surrounding the second metal layer by oxidizing the diffused material of the first metal layer;
    forming a gate insulation layer on the substrate, the gate line and the metallic oxide layer;
    forming an amorphous silicon layer on the gate insulation layer;
    forming an impurity-doped amorphous silicon layer on the amorphous silicon layer;
    forming a third metal layer on the impurity-doped amorphous silicon layer;
    patterning the third metal layer so as to form a data line, a source electrode and a drain electrode;
    patterning the impurity-included amorphous silicon layer using the patterned third metal layer as masks so as to form an ohmic contact layer and a channel region in the amorphous silicon layer between the source and drain electrodes;
    forming a protection layer on the amorphous silicon layer and on the patterned third metal layer;
    patterning the protection layer, the amorphous silicon layer and the gate insulation layer except portions that correspond to the patterned third metal layer and channel region;
    depositing a transparent conductive material in a pixel region that is defined by the gate and data lines; and
    patterning the transparent conductive material so as to form a pixel electrode that contacts the drain electrode.

2. The method according to claim 1, wherein the first metal layer is one of tantalum (Ta), chromium (Cr), titanium (Ti) or tungsten (W).

3. The method according to claim 2, wherein the metallic oxide layer is one of tantalum oxide ($TaO_x$), chromium oxide ($CrO_x$), titanium oxide ($TiO_x$) or tungsten oxide ($WO_x$).

4. The method according to claim 1, wherein the third metal layer is one of chromium (Cr), tantalum (Ta), titanium (Ti), tungsten (W) or molybdenum (Mo).

5. The method according to claim 1, further comprising:
    forming a buffering layer on the substrate before forming the first metal layer.

6. The method according to claim 5, wherein the buffering layer is one of silicon nitride ($SiN_x$) or silicon oxide ($SiO_2$).

7. The method according to claim 1, wherein thermal treatment of the substrate is performed at a temperature of greater than 400° C.

8. A method of forming a TFT array substrate for use in a liquid crystal display device, comprising:
    forming a first metal layer over a substrate;
    forming a second metal layer of copper (Cu) on the first metal layer;
    patterning the first and second metal layers so as to form a gate line and a gate electrode;
    thermally-treating the substrate having the patterned first and second metal layers so as to diffuse material from the patterned first metal layer over the patterned second metal layer and then to form a metallic oxide layer surrounding the second metal layer by oxidizing the diffused material of the first metal layer;
    forming a gate insulation layer on the substrate, the gate line and the metallic oxide layer;
    forming an amorphous silicon layer on the gate insulation layer;
    forming an impurity-doped amorphous silicon layer on the amorphous silicon layer;
    forming a third metal layer on the impurity-doped amorphous silicon layer;
    patterning the third metal layer so as to form a data line, a source electrode and a drain electrode;
    patterning the impurity-included amorphous silicon layer using the patterned third metal layer as masks so as to form an ohmic contact layer and a channel region in the amorphous silicon layer between the source and drain electrodes;
    forming a protection layer on the amorphous silicon layer and on the patterned third metal layer;
    patterning the protection layer, the amorphous silicon layer and the gate insulation layer except portions that correspond to the patterned third metal layer and channel region;
    depositing a transparent conductive material in a pixel region that is defined by the gate and data lines; and
    patterning the transparent conductive material so as to form a pixel electrode that contacts the drain electrode.

9. A method of forming a TFT array substrate for use in a liquid crystal display device, comprising:
    forming a buffering layer on a substrate, the buffering layer being one of tantalum nitride (TaN) or titanium nitride (TiN);
    forming a first metal layer over the buffering layer;
    forming a second metal layer on the first metal layer;
    patterning the first and second metal layers so as to form a gate line and a gate electrode;
    thermally-treating the substrate having the patterned first and second metal layers so as to diffuse material from the patterned first metal layer over the patterned second metal layer and then to form a metallic oxide layer surrounding the second metal layer by oxidizing the diffused material of the first metal layer;

forming a gate insulation layer on the substrate, the gate line and the metallic oxide layer;

forming an amorphous silicon layer on the gate insulation layer;

forming an impurity-doped amorphous silicon layer on the amorphous silicon layer;

forming a third metal layer on the impurity-doped amorphous silicon layer;

patterning the third metal layer so as to form a data line, a source electrode and a drain electrode;

patterning the impurity-included amorphous silicon layer using the patterned third metal layer as masks so as to form an ohmic contact layer and a channel region in the amorphous silicon layer between the source and drain electrodes;

forming a protection layer on the amorphous silicon layer and on the patterned third metal layer;

patterning the protection layer, the amorphous silicon layer and the gate insulation layer except portions that correspond to the patterned third metal layer and channel region;

depositing a transparent conductive material in a pixel region that is defined by the gate and data lines; and patterning the transparent conductive material so as to form a pixel electrode that contacts the drain electrode.

10. A method of forming an insulated conductor structure for use in a TFT array substrate of a liquid crystal display device, the method comprising:

providing a substrate;

forming a first metal layer over a substrate;

forming a second metal layer on the first metal layer;

patterning the first and second metal layers so as to form a conductive line and a conductive electrode thus defining an intermediate structure;

thermally treating said intermediate structure so as to diffuse material from the patterned first metal layer over the patterned second metal layer and then to form a metallic oxide layer surrounding the patterned second metal layer; and forming an insulation layer on the substrate, the conductive line and said metallic oxide layer.

11. The method according to claim 10, wherein the first metal layer is one of tantalum (Ta), chromium (Cr), titanium (Ti) or tungsten (W) and the metallic oxide is one of tantalum oxide ($TaO_x$), chromium oxide ($CrO_x$), titanium oxide ($TiO_x$) or tungsten oxide ($WO_x$), respectively.

12. The method according to claim 10, further comprising:

forming a buffering layer on the substrate before forming the first metal layer.

13. The method according to claim 12, wherein the buffering layer is one of tantalum nitride (TaN), titanium nitride (TiN), silicon nitride ($SiN_x$) or silicon oxide ($SiO_2$).

14. A method of forming an insulated conductor structure for use in a TFT array substrate of a liquid crystal display device, the method comprising:

providing a substrate;

forming a first metal layer over a substrate;

forming a second metal layer of copper (Cu) on the first metal layer;

patterning the first and second metal layers so as to form a conductive line and a conductive electrode thus defining an intermediate structure;

thermally treating said intermediate structure so as to diffuse material from the patterned first metal layer over the patterned second metal layer and then to form a metallic oxide layer surrounding the patterned second metal layer; and forming an insulation layer on the substrate, the conductive line and said metallic oxide layer.

* * * * *